United States Patent
Tsai

(10) Patent No.: US 12,147,297 B2
(45) Date of Patent: Nov. 19, 2024

(54) MEMORY ADDRESS GENERATION DEVICE, METHOD AND TESTING DEVICE FOR TEST MODE AND MEMORY APPARATUS

(71) Applicant: NUVOTON TECHNOLOGY CORPORATION, Hsinchu (TW)

(72) Inventor: Wen Hao Tsai, Hsinchu (TW)

(73) Assignee: NUVOTON TECHNOLOGY CORPORATION, Hsinchu (TW)

(*) Notice: Subject to any disclaimer, the term of this patent is extended or adjusted under 35 U.S.C. 154(b) by 61 days.

(21) Appl. No.: 18/326,532

(22) Filed: May 31, 2023

(65) Prior Publication Data

US 2024/0134735 A1 Apr. 25, 2024
US 2024/0231992 A9 Jul. 11, 2024

(30) Foreign Application Priority Data

Oct. 24, 2022 (TW) .................................. 111140324

(51) Int. Cl.
*G06F 11/07* (2006.01)
*G06F 12/02* (2006.01)

(52) U.S. Cl.
CPC .......... *G06F 11/079* (2013.01); *G06F 11/073* (2013.01); *G06F 11/076* (2013.01); *G06F 12/023* (2013.01); *G06F 2212/1032* (2013.01)

(58) Field of Classification Search
CPC ..... G06F 11/079; G06F 11/073; G06F 11/076
See application file for complete search history.

(56) References Cited

U.S. PATENT DOCUMENTS 10,580,513 B2 * 3/2020 Maeda .................... G11C 29/52
10,847,243 B2 * 11/2020 Shim ...................... G11C 29/38

* cited by examiner

*Primary Examiner* — Nadeem Iqbal
(74) *Attorney, Agent, or Firm* — MUNCY, GEISSLER, OLDS & LOWE, P.C.

(57) ABSTRACT

A memory address generation device for a test mode comprises row and column address random number counters and a control unit. The row address random number counter receives a counting signal to update a first count value, generates a row address random number based on the first count value, and outputs a row address to the memory. The column address random number counter receives the counting signal to update a second count value, generates a column address random number based on the second count value, and outputs a column address to the memory. The control unit controls the test mode and sets the first/second count value. A difference value between the currently and previously generated row addresses is greater than or equal to 2, and a difference value between the currently and previously generated column addresses is greater than or equal to 2.

15 Claims, 4 Drawing Sheets

11

| 6  | 46 | 22 | 62 | 38 | 14 | 54 | 30 |
|----|----|----|----|----|----|----|----|
| 27 | 3  | 43 | 19 | 59 | 35 | 11 | 51 |
| 48 | 24 | 0  | 40 | 16 | 56 | 32 | 8  |
| 13 | 53 | 29 | 5  | 45 | 21 | 61 | 37 |
| 34 | 10 | 50 | 26 | 2  | 42 | 18 | 58 |
| 63 | 39 | 15 | 55 | 31 | 7  | 47 | 23 |
| 20 | 60 | 36 | 12 | 52 | 28 | 4  | 44 |
| 41 | 17 | 57 | 33 | 9  | 49 | 25 | 1  |

| 41 | 9  | 33 | 57 | 17 | 49 | 25 | 1  |
|----|----|----|----|----|----|----|----|
| 20 | 52 | 12 | 36 | 60 | 28 | 4  | 44 |
| 63 | 31 | 55 | 15 | 39 | 7  | 47 | 23 |
| 34 | 2  | 26 | 50 | 10 | 42 | 18 | 58 |
| 13 | 45 | 5  | 29 | 53 | 21 | 61 | 37 |
| 48 | 16 | 40 | 0  | 24 | 56 | 32 | 8  |
| 27 | 59 | 19 | 43 | 3  | 35 | 11 | 51 |
| 6  | 38 | 62 | 22 | 46 | 14 | 54 | 30 |

FIG. 6

MEMORY ADDRESS GENERATION DEVICE, METHOD AND TESTING DEVICE FOR TEST MODE AND MEMORY APPARATUS

CROSS-REFERENCE TO RELATED APPLICATION

This application claims the priority from the TW Patent Application No. 111140324, filed on Oct. 24, 2022, and all contents of such TW Patent Application are comprised in the present disclosure.

BACKGROUND

1. Field of the Invention

The present disclosure relates to a memory testing technology, and in particular to a memory address generation device, a testing device and a memory apparatus that can detect faults other than adjacent memory cells and can quickly test a memory.

2. Description of the Related Art

For memories, a memory comprises tens of thousands of memory cells, it is difficult to ensure that each memory cell is normal and fault-free. Therefore, the memory test is carried out before delivery or use. In other words, there is a test mode in a memory apparatus to test whether the memory cell is defective or not. After the defective memory cell is marked, the redundant memory cell is used to replace the marked memory cell, or the marked memory cell is no longer used.

Please refer to FIG. 1, FIG. 1 is a block diagram of a memory apparatus of the related art. As shown in FIG. 1, the memory apparatus 1 comprises a memory 11, a multiplexer 12, a testing device 13, a processing core 14 and a bus interface 15. The memory 11 is electrically connected to the multiplexer 12, the testing device 13 and the processing core 14. The processing core 14 is electrically connected to the multiplexer 12 and the bus interface 15. In the normal mode, the multiplexer 12 selects a writing instruction, a writing data and a read instruction transmitted from the processing core 14 to the memory 11. The processing core 14 receives the read data retuned from the memory 11 responding to the read instruction. Besides, each of the read instruction and the writing instruction comprises a memory address. Usually, the writing instruction, the read instruction and the writing data are generated in response to the access requirements from an external device which is connected to the bus interface 15.

In the test mode, the multiplexer 12 selects the writing instruction, the writing data and the read instruction transmitted from the testing device 13 to memory 11. In FIG. 1, the testing device 13 is a built-in self-test (BIST) memory testing device. However, the testing device 13 may be an external memory testing device instead of one component of the memory device 1. The testing device 13 comprises a memory address generation device and a test data generation device. The testing device 13 is used to generate the writing instruction and the writing data for testing the memory 11 based on the generated memory address. The memory 11 writes the writing data into the memory cell corresponding to the memory address based on the writing instruction. Next, the testing device 13 generates the read instruction to obtain the read data of the memory cell corresponding to the memory address, and further determines whether the memory cell is fault-free or not.

Next, please refer to FIG. 1 and FIG. 2, FIG. 2 is a schematic diagram of a plurality of memory addresses generated sequentially by a memory address generation device of a testing device in the related art. As shown in FIG. 2, the memory 11 comprises 64 memory cells in total. The numbers marked on the memory cells are the selected order. Besides, the number 0 means the first selected memory cell, and the number 63 means the last selected memory cell. In other words, in this example, the memory addresses sequentially generated by the memory address generation device corresponding to selected memory cells are in the first row/the first column, the first row/the second column, . . . , the first row/the eighth column, the second row/the first column, the second row/the second column, . . . , the eighth row/the eighth column, respectively. However, in most cases, the currently test and the previously test are performed on the memory cells of two adjacent bit lines of the same word line. Thus, it is difficult to detect the memory cell of which access time is out of the specification, and only the hardware defects of two locally adjacent memory cells can be detected.

Next, please refer to FIG. 1 and FIG. 3, FIG. 3 is another schematic diagram of a plurality of memory addresses generated sequentially by a memory address generation device of a testing device in the related art. As shown in FIG. 3, the memory 11 comprises 64 memory cells in total. The numbers marked on the memory cells are the selected order. Besides, the number 0 means the first selected memory cell, the number 18 means that the $19^{th}$ selected memory cell, and so on. In this example, the difference index value of the word line and the bit line of the memory cells selected by the memory address generation device in the current test and the previously test is 1. That is, the memory cell of the previously test is different from the memory cell of the current test by one row and one column. The manner of FIG. 3 still has the same technical problem with the manner of FIG. 2. That is to say, it is still difficult to detect the memory cells of which access time is out of the specification in FIG. 3. The manner of FIG. 3 may only detect hardware defects of two locally adjacent memory cells. In view of this, a memory generation mechanism used in the test mode is needed to solve the above technical problem.

SUMMARY

In order to achieve one of the purposes of the present disclosure, embodiments of the present disclosure provide a memory address generation device for a test mode. The memory address generation device comprises a row address random number counter, a column address random number counter and a control unit. The control unit is electrically connected to the row address random number counter and the column address random number counter. The row address random number counter is used to receive a counting signal to update the first count value, generate a row address random number based on the first count value, and output the row address random number as a row address to the memory. The column address random number counter is used to receive the counting signal to update the second count value, generate a column address random number based on the second count value, and output the column address random number as a column address to the memory. The row address and the column address form a memory address. The control unit ends the test mode when the first count value is the first specific value and the second count value is the second specific value. The control unit sets the first count value of the row address random number counter and the second count value of the column address random number counter when the first count value is the first specific value but the second count value is not the second specific value. The row address random number counter and the column address random number counter use the cyclic count. In addition, a difference value between the currently generated row address and the previously generated row address is greater than or equal to 2, and a difference value between the currently generated column address and the previously generated column address is greater than or equal to 2.

In order to achieve one of the purposes of the present disclosure, the embodiments of the present disclosure provide a testing device for a test mode. The testing device comprises the aforementioned memory address generation device and a tester. The tester is electrically connected to the memory address generation device. The tester is used to generate the writing instruction and the writing data for testing the memory so that the memory writes the writing data into a memory cell corresponding to the memory address based on the writing instruction. The tester is used to obtain the read data output by the memory based on a read instruction and further test whether the memory cell corresponding to the memory address is fault-free.

In order to achieve one of the purposes of the present disclosure, the embodiments of the present disclosure provide a memory apparatus. The memory apparatus comprises the aforementioned testing device and the memory.

In order to achieve one of the purposes of the present disclosure, the embodiments of the present disclosure provide a memory address generation method for a test mode. The method comprises the following step. The row address random number counter is used to receive a counting signal to update the first count value. The row address random number is generated based on the first count value, and the row address random number is output as a row address to the memory. The column address random number counter is used to receive the counting signal to update the second count value. The column address random number is generated based on the second count value, and the column address random number is output as a column address to the memory. The row address and the column address form the memory address. The control unit is used to end the test mode when the first count value is the first specific value and the second count value is the second specific value. The control unit is used to set the first count value of the row address random number counter and the second count value of the column address random number counter when the first count value is the first specific value but the second count value is not the second specific value. The row address random number counter and the column address random number counter use a cyclic count. A difference value between the currently generated row address and the previously generated row address is greater than or equal to 2. Also, a difference value between the currently generated column address and the previously generated column address is greater than or equal to 2.

To sum up, the memory address generation device, the testing device and the memory apparatus provided by the embodiments of the present disclosure can detect faults other than adjacent memory cells and detect whether the access time of any memory cell is out of the specification. In addition, the test time is less than that of the related art.

To further understand the technology, means, and effects of the present disclosure, reference may be made by the detailed description and drawing as follows. Accordingly, the purposes, features and concepts of the present disclosure can be thoroughly and concretely understood. However, the following detail description and drawings are only used to reference and illustrate the implementation of the present disclosure, and they are not used to limit the present disclosure.

BRIEF DESCRIPTION OF THE DRAWINGS

The drawings are provided to make the persons with ordinary knowledge in the field of the art further understand the present disclosure, and are incorporated into and constitute a part of the specification of the present disclosure. The drawings illustrate demonstrated embodiments of the present disclosure, and are used to explain the principal of the present disclosure together with the description of the present disclosure.

FIG. 5 is a schematic diagram of a plurality of memory addresses generated sequentially by a memory address generation device of a testing device according to an embodiment of the present disclosure;

FIG. 6 is another schematic diagram of a plurality of memory addresses generated sequentially by a memory address generation device of a testing device according to an embodiment of the present disclosure.

DESCRIPTION OF THE PREFERRED EMBODIMENTS

Figures 1, 2:
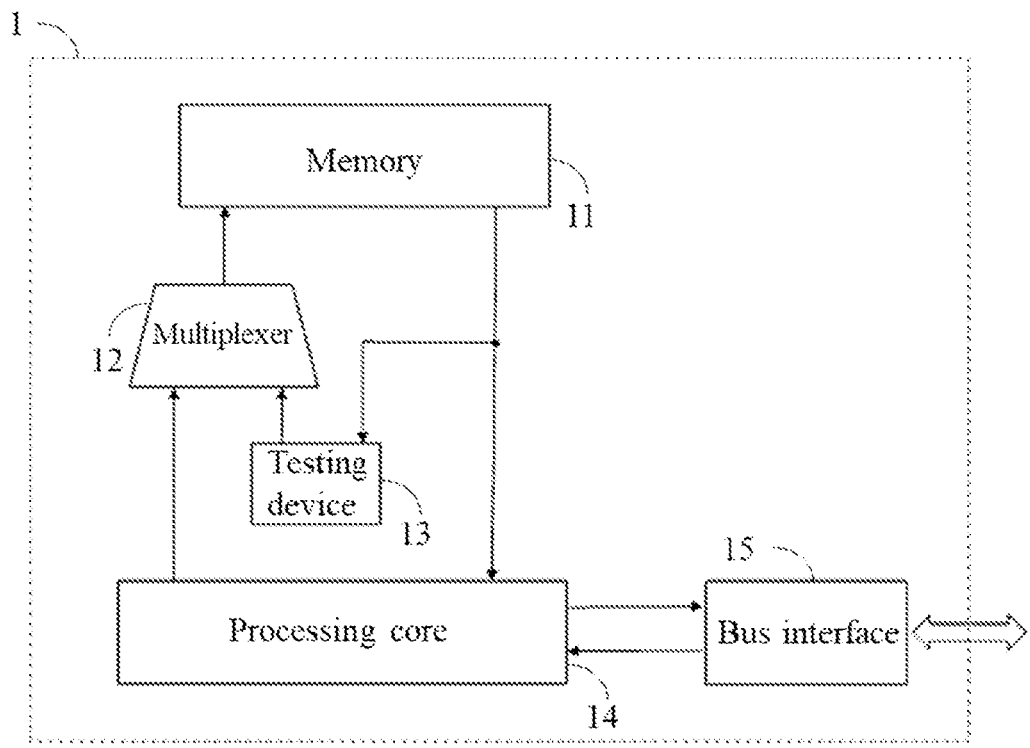
FIG. 1 is a block diagram of a memory device in the related art.
FIG. 2 is a schematic diagram of a plurality of memory addresses generated sequentially by a memory address generation device of a testing device in the related art.

The embodiments of the present disclosure are described in detail as reference, and the drawings of the present disclosure are illustrated. In the case of possibility, the element symbols are used in the drawings to refer to the same or similar components. In addition, the embodiment is only one approach of the implementation of the design concept of the present disclosure, and the following multiple embodiments are not intended to limit the present disclosure.

In embodiments of the present disclosure, a memory address generation mechanism is proposed. The random number counters are utilized to generate memory addresses, so that a difference value between the currently generated row address and the previously generated row address is greater than or equal to 2, and a difference value between the currently generated column address and the previously generated column address is greater than or equal to 2. In this way, the embodiments of the present disclosure not only detect faults other than adjacent memory cells, but also detect the memory quickly. Even more, the embodiments of the present disclosure can detect whether the access time of any memory cell is out of the specification.

Figures 3, 4:
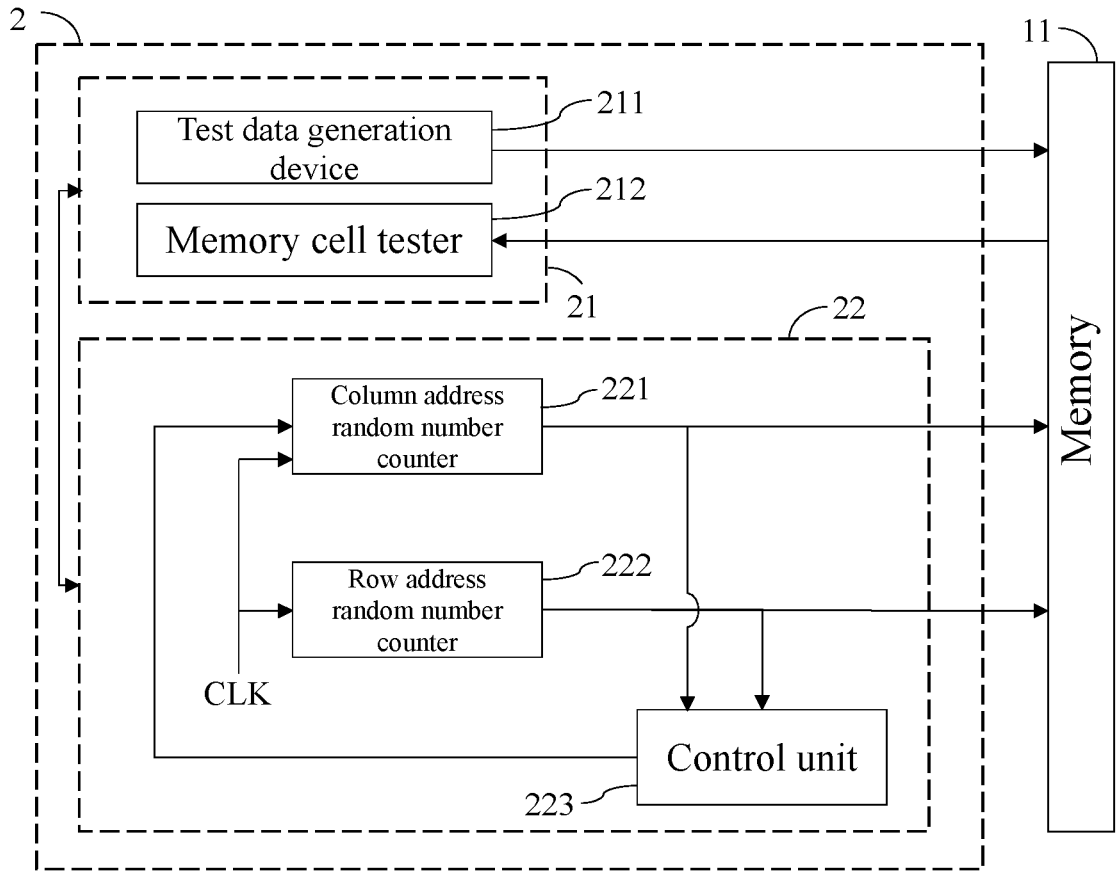
FIG. 3 is another schematic diagram of a plurality of memory addresses generated sequentially by a memory address generation device of a testing device in the related art.
FIG. 4 is a block diagram of a testing device according to an embodiment of the present disclosure.

Please refer to FIG. 1 and FIG. 4, FIG. 4 is a block diagram of a testing device according to an embodiment of the present disclosure. The testing device 2 of FIG. 4 may be used to replace the testing device 13 of FIG. 1. The testing device 2 may also be a built-in self-test (BIST) memory testing device. Of course, in other embodiments, the testing device 2 may also be an external memory testing device. After replacing the testing device 13 of FIG. 1 with the testing device 2 of FIG. 4, the memory apparatus provided by the embodiments of the present disclosure is implemented. Simply speaking, in one of the embodiments of the present disclosure, the memory apparatus may comprise the testing device 2 of FIG. 2 and the memory 11, the multiplexer 12, the processing core 14 and the bus interface 15 of FIG. 1. Moreover, the memory 11 is electrically connected to the multiplexer 12, the testing device 2 and the processing core 14. The processing core 14 is electrically connected to the multiplexer 12 and the bus interface 15.

Then, please only refer to FIG. 4. The testing device 2 comprises a tester 21 and a memory address generation device 22. The tester 21 is electrically connected to the memory address generation device 22. The tester 21 is used to generate a writing instruction and a writing data for testing the memory 11 so that the memory 11 writes the writing data into the memory cell corresponding to the memory address based on the writing instruction. The tester 21 is used to obtain a read data output by the memory based on a read instruction, and further detect whether the memory cell corresponding to the memory address is fault-free. Further, the tester 21 comprises a test data generation device 211 and a memory cell tester 212. The test data generation device 211 is used to generate the writing instruction and the writing data for testing memory 11 so that the memory 11 writes the writing data into the memory cell corresponding to the memory address based on the writing instruction. The memory cell tester 212 is used to obtain the read data output by the memory based on the read instruction and further detect whether the memory cell corresponding to the memory address is fault-free.

The memory address generation device 22 generates the memory address in the test mode. However, the memory address generation device 22 is not used to generate the memory address in the normal mode. The memory address generation device 22 comprises the column address random number counter 221, the row address random number counter 222, and the control unit 223. The control unit 223 is electrically connected to the row address random number counter 222 and the column address random number counter 221. The row address random number counter 222 is used to receive the counting signal to update the first count value i. The counting signal may usually use the clock signal CLK. The update of the first count value i is triggered by the rising edge of the clock signal CLK, but the present disclosure is not limited thereto. The row address random number counter 222 generates the row address random number $R_i$ based on the first count value i. The row address random number counter 222 outputs the row address random number $R_i$ as a row address to the memory 11. Besides, i is a positive integer from 0 to N, and N is the maximum count value of the row address random number counter 222.

The column address random number counter 221 is used to receive the counting signal, for example, the clock signal CLK to update the second count value k. The column address random number counter 221 generates the column address random number $C_k$ based on the second count value k. Also, the column address random number counter 221 output the column address random number $C_k$ as a column address to the memory 11. Besides, k is a positive integer from 0 to M, and M is the maximum count value of the column address random number counter 221. In this embodiment, N and M may be designed to be the same. That is, M=N, but the present disclosure is not limited thereto. The values of N and M depend on the size of the array formed by the memory cells of the memory 11. That is, the size of the array of the memory cells of the memory 11 is N rows and M columns. Then, the maximum count value of the column address random number counter 221 is M, and the maximum count value of the row address random number counter 222 is N.

The row address random number counter 221 and the column address random number counter 222 use the cyclic count. In other words, the first count value i updated again is 0 when the first count value i is counted to N. Similarly, the second count value k updated again is 0 when the second count value k is counted to M. Furthermore, in the some embodiments of the present disclosure, both of the column address random number counter 221 and the row address random number counter 222 are the progressive counters, that is, the count value is incremented by one each time. However, in other embodiments of the present disclosure, both of the column address random number counter 221 and the row address random number counter 222 may be changed to utilize the down counters, that is, the count value is decremented by one each time. Alternatively, in other embodiments of the present disclosure, one of the column address random number counter 221 and the row address random number counter 222 utilizes the progressive counter, and the other of the column address random number counter 221 and the row address random number counter 222 utilizes the down counter. For the convenience of description, the following embodiments are examples that both of the column address random number counter 221 and the row address random number counter 222 utilize the progressive counters, that is, the count value is incremented by one each time, but the present disclosure is not limited thereto.

In addition, in order to be able to detect faults other than adjacent memory cells, and even detect whether the access time of any memory cell is out of the specification, it is necessary to make the difference value between the currently generated row address and the previously generated row address be greater than or equal to 2, and make the difference value between the currently generated column address and the previously generated column address be greater than or equal to 2 in design. Further, in order to make the difference value between the currently generated row address and the previously generated row address be greater than or equal to 2 and make the difference value between the currently generated column address and the previously generated column address be greater than or equal to 2, it may be designed that the Hamming distance between the currently generated row address and the previously generated row address is greater than or equal to 2 and the Hamming distance between the currently generated column address and the previously generated column address is greater than or equal to 2. In other words, the Hamming distance between $R_j$ and $R_{j+1}$ is greater than or equal 2, and the Hamming distance between $R_0$ and $R_N$ is greater than or equal 2, wherein j is an integer from 0 to N−1. As well, the Hamming distance between $C_x$ and $C_{x+1}$ is greater than or equal 2, and the Hamming distance between $C_0$ and $C_M$ is greater than or equal 2. Besides, x is an integer from 0 to M−1.

Furthermore, the control unit 223 ends the test mode when the first count value i is the first specific value and the second count value k is the second specific value, that is, when the initial values of the first count value i and the second count value k are 0, the first specific value may be designed to be N and the second specific value may be designed to be M−1. In other words, the control unit 223 ends the test mode when each of the memory cells in the array of the (N+1) row and (M+1) column is tested. The control unit 223 sets the first count value i of the row address random number counter 222 and the second count value k of the column address random number counter 221 when the first count value i is the first specific value but the second count value k is not the second specific value, that is, when the initial values of the first count value i and the second count value k are 0, the first specific value may be designed to be N and the second specific value may be designed to be M−1.

For example, when the initial values of the first count value i and the second count value k is 0, and the first count value i and the second count value k are counted from 0 to N, the control unit 223 needs to reset the first count value i into 0 and the second count value k into 1. Next, after the first count value i is counted to N from 0 and the second count value k is counted to N and 0 from 1, the control unit 223 needs to reset the first count value i into 0 and the second count value k into 2. It is noted that cyclic count is utilized. Also, the details of later resetting and counting can be deduced in this way. The first count value i is counted from 0 to N and the second count value k is counted from M, 0 to M−1 after the first count value i is reset to 0 and the second count value k is reset to M. Then, since each of the memory cells in the array of the N rows and M columns has been tested, the control unit 223 ends the test mode.

Please refer to FIG. 5, FIG. 5 is a schematic diagram of a plurality of memory addresses generated sequentially by a memory address generation device of a testing device according to an embodiment of the present disclosure. The numbers marked on the memory cells represent the selected order, wherein the number 0 means the first selected memory cell, and the number 63 means the last selected memory cell. In the embodiment of FIG. 5, taking M=N=7 as an example, the memory 11 has memory cells with 8 rows and 8 columns, that is, 64 memory cells in total. In this embodiment, the row address random number $R_i$ of the first count value i from 0 to N is respectively $R_0=\{101\}$, $R_1=\{000\}$, $R_2=\{101\}$, $R_3=\{110\}$, $R_4=\{001\}$, $R_5=\{100\}$, $R_6=\{111\}$ and $R_7=\{010\}$. In order to reduce design complexity and storage space, the column address random number $C_k$ is designed as $C_k=R_{M-k}$ (k is an integer from 0 to M). Therefore, the column address random number $C_k$ of the second count value k from 0 to M is respectively $C_0=\{010\}$, $C_1=\{111\}$, $C_2=\{100\}$, $C_3=\{001\}$, $C_4=\{110\}$, $C_5=\{011\}$, $C_6=\{000\}$ and $C_7=\{101\}$. Additionally, $R_0$ and $R_7$ are completely inverse to each other, $R_1$ and $R_6$ are completely inverse to each other, $R_2$ and $R_5$ are completely inverse to each other, and $R_3$ and $R_4$ are completely inverse to each other. Thus, as long as the storage space is used to store $R_0 \sim R_3$, $R_0 \sim R_7$ and $C_0 \sim C_7$ can be generated.

According to the above manner, the memory addresses generated in the test mode are $R_0C_0$, $R_1C_1$, $R_2C_2$, $R_3C_3$, $R_4C_4$, $R_5C_5$, $R_6C_6$, $R_7C_7$, $R_0C_1$, $R_1C_2$, $R_2C_3$, $R_3C_4$, $R_4C_5$, $R_5C_6$, $R_6C_7$, $R_7C_0$, $R_0C_2$, $R_1C_3$, $R_2C_4$, $R_3C_5$, $R_4C_6$, $R_5C_7$, $R_6C_0$, $R_7C_1$, . . . , $R_0C_7$, $R_1C_0$, $R_2C_1$, $R_3C_2$, $R_4C_3$, $R_5C_4$, $R_6C_5$ and $R_7C_6$. Corresponding to the above memory addresses, the first selected memory cell is the $6^{th}$ row and the $3^{rd}$ column, the second selected memory cell is the $1^{st}$ row and the $8^{th}$ column, and the third selected memory cell is the $4^{th}$ row and the $5^{th}$ column. It can be known that the above the difference value between the currently generated row address and the previously generated row address is greater than or equal to 2, and the difference value between the currently generated column address and the previously generated column address is greater than or equal to 2. As a result, the embodiments of the present disclosure cannot only detect faults other than the adjacent memory cells, but also can quickly test memory. Furthermore, the embodiments of the present disclosure can detect whether the access time of the memory cell is out of the specification.

Next, please refer to FIG. 6, FIG. 6 is another schematic diagram of a plurality of memory addresses generated sequentially by a memory address generation device of a testing device according to an embodiment of the present disclosure. The numbers marked on the memory cells represent the selected order, wherein the number 0 means the first selected memory cell, and the number 63 means the selected last memory cell. In the embodiment of FIG. 6, taking M=N=7 as example, the memory 11 has memory cells with 8 rows and 8 columns, that is, 64 memory cells in total. In this embodiment, the row address random number $R_i$ of the first count value i from 0 to N is respectively $R_0=\{010\}$, $R_1=\{111\}$, $R_2=\{100\}$, $R_3=\{001\}$, $R_4=\{110\}$, $R_5=\{011\}$, $R_6=\{000\}$ and $R_7=\{101\}$. The column address random number $C_k$ of the second count value k from 0 to M is respectively $C_0=\{011\}$, $C_1=\{111\}$, $C_2=\{001\}$, $C_3=\{100\}$, $C_4=\{110\}$, $C_5=\{010\}$, $C_6=\{000\}$ and $C_7=\{101\}$.

According to the above manner, the memory addresses generated in the test mode are $R_0C_0$, $R_1C_1$, $R_2C_2$, $R_3C_3$, $R_4C_4$, $R_5C_5$, $R_6C_6$, $R_7C_7$, $R_0C_1$, $R_1C_2$, $R_2C_3$, $R_3C_4$, $R_4C_5$, $R_5C_6$, $R_6C_7$, $R_7C_0$, $R_0C_2$, $R_1C_3$, $R_2C_4$, $R_3C_5$, $R_4C_6$, $R_5C_7$, $R_6C_0$, $R_7C_1$, . . . , $R_0C_7$, $R_1C_0$, $R_2C_1$, $R_3C_2$, $R_4C_3$, $R_5C_4$, $R_6C_5$ and $R_7C_6$. Corresponding to the above memory addresses, the first selected memory cell is the $3^{rd}$ row and the $4^{th}$ column, the second selected memory cell is the $8^{th}$ row and the $8^{th}$ column, and the third selected memory cell is the $5^{th}$ row and the $2^{nd}$ column. It can be known that the above the difference value between the currently generated row address and the previously generated row address is greater than or equal to 2, and the difference value between the currently generated column address and the previously generated column address is greater than or equal to 2. As a result, the embodiments of the present disclosure cannot only detect faults other than the adjacent memory cells, but also can quickly test memory. Furthermore, the embodiments of the present disclosure can detect whether the access time of the memory cell is out of the specification.

Figure 7:
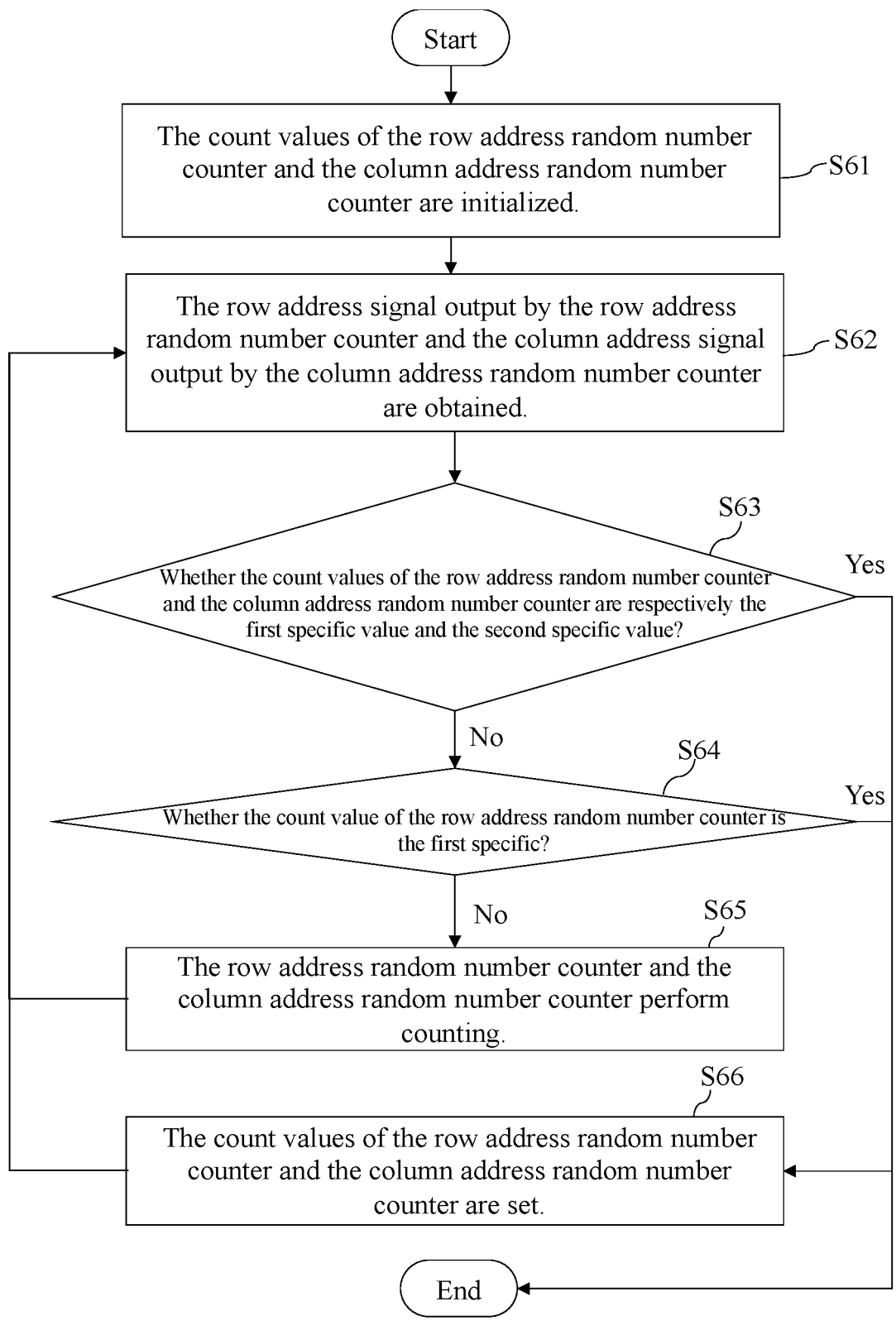
FIG. 7 is flowchart of a memory address generation method according to an embodiment of the present disclosure.

Please refer to FIG. 7, FIG. 7 is flowchart of a memory address generation method according to an embodiment of the present disclosure. The memory address generation method in FIG. 7 can be implemented by the memory address generation device 22 in FIG. 4. In step S61, the count values of the row address random number counter and the column address random number counter are initialized. For example, the count values of the row address random number counter and the column address random number counter are initialized to 0. In step S62, the row address signal output by the row address random number counter and the column address signal output by the column address random number counter are obtained to form the memory address used in the test mode. Besides, the memory address is used to generate the writing instruction and the read instruction to test the memory.

In step S63, it is determined whether the count value of the row address random number counter is the first specific value and the count value of the column address random number counter is the second specific value. That is, it is determined whether each memory cell is selected for testing. When the count value of the row address random number counter reaches the first specific value and the count value of the column address random number counter reaches the second specific value, the memory address generation method is ended. Further, the test mode is ended. When the count values of the row address random number counter does not reach the first specific value and the column address random number counter does not reach the second specific value respectively, step S64 is executed. In step S64, it is determined whether the count value of the row address random number counter is the first specific value. If so, it means that the count value of the row address random number counter reaches the maximum count value, and the count value of the row address random number counter and the count value of the column address random number counter have to be reset. Therefore, step S66 needs to be executed. Otherwise, step S65 is executed. In step S65, the row address random number counter and the column address random number counter perform counting to update the count values, and then return to step S62. In step S66, the count value of the row address random number counter and the count value of the column address random number counter are set, and then return to step S62.

As stated as above, the memory address generation device, the testing device and the memory apparatus provided by the embodiments of the present disclosure mainly utilize random number counters to generate memory addresses so that the difference value between the currently generated row address and the previously generated row address is greater than or equal to 2, and the difference value between the currently generated column address and the previously generated column address is greater than or equal to 2. In this way, the embodiments of the present disclosure cannot only detect faults other than the adjacent memory cells, but also can test memory quickly. Furthermore, the embodiments of the present disclosure can detect whether the access time of the memory cell is out of the specification. Moreover, the implementation manner of the present disclosure does not require complex hardware circuits, so there is no large cost problem. Also, the chip area of the original memory apparatus does not be too large.

It should be understood that the examples and the embodiments described herein are for illustrative purpose only, and various modifications or changes in view of them will be suggested to those skilled in the art, and will be comprised in the spirit and scope of the application and the appendix with the scope of the claims.

What is claimed is:

1. A memory address generation device for a test mode, comprising:
   a row address random number counter, configured to receive a counting signal to update a first count value, generate a row address random number based on the first count value, and output the row address random number as a row address to a memory;
   a column address random number counter, configured to receive the counting signal to update a second count value, generate a column address random number based on the second count value, and output the column address random number as a column address to the memory, wherein the row address and the column address form a memory address; and
   a control unit, electrically connected to the column address random number counter and the row address random number counter,
      wherein when the first count value is a first specific value and the second count value is a second specific value, the control unit ends the test mode, and
      wherein when the first count value is the first specific value but the second count value is not the second specific value, the control unit sets the first count value of the row address random number counter and the second count value of the column address random number counter;
   wherein the row address random number counter and the column address random number counter use a cyclic count, and
   wherein a difference value between the currently generated row address and the previously generated row address is greater than or equal to 2, and a difference value between the currently generated column address and the previously generated column address is greater than or equal to 2.

2. The memory address generation device according to claim 1, wherein the plurality of row address random numbers corresponding to the first count value counted from 0 to the first specific value N are respectively $R_0, R_1, \ldots, R_N$ in sequence,
   wherein the plurality of column address random numbers corresponding to the second count value counted from 0 to N are respectively $C_0, C_1, \ldots, C_N$ in sequence, and
   wherein $C_i = R_{N-i}$, is an integer from 0 to N, and N is a maximum count value of each of the row address random number counter and the column address random number counter.

3. The memory address generation device according to claim 2, wherein both of the row address random number counter and the column address random number counter are progressive counters or down counters, or
   wherein the row address random number counter is the progressive counter, and the column address random number counter is the down counter, or
   wherein the row address random number counter is the down counter, and the column address random number counter is the progressive counter.

4. The memory address generation device according to claim 3, wherein when both of the row address random number counter and the column address random number counter are the progressive counters, the first specific value is N, the second specific value is N−1, an initial value of the first count value is 0, and an initial value of the second count value is 0.

5. A testing device for a test mode, comprising:
   a memory address generation device, configured for the test mode, and comprising:
      a row address random number counter, configured to receive a counting signal to update a first count value, generate a row address random number based on the first count value, and output the row address random number as a row address to a memory;
      a column address random number counter, configured to receive the counting signal to update a second count value, generate a column address random number based on the second count value, and output the column address random number as a column address to the memory, wherein the row address and the column address form a memory address; and
      a control unit, electrically connected to the row address random number counter and the column address random number counter,
         wherein when the first count value is a first specific value and the second count value is a second specific value, the control unit ends the test mode, and wherein when the first count value is the first specific value but the second count value is not the second specific value, the control unit sets the first count value of the row address random number counter and the second count value of the column address random number counter;

wherein the row address random number counter and the column address random number counter use a cyclic count, and wherein a difference value between the currently generated row address and the previously generated row address is greater than or equal to 2, and a difference value between the currently generated column address and the previously generated column address is greater than or equal to 2; and a tester, electrically connected to the memory address generation device, configured to generate a writing instruction and a writing data for testing the memory so that the memory writes the writing data into a memory cell corresponding to the memory address based on the writing instruction, and configured to obtain a read data output by the memory based on a read instruction to further test whether the memory cell corresponding to the memory address is fault-free.

6. The tester for according to claim 5, wherein the plurality of row address random numbers corresponding to the first count value counted from 0 to the first specific value N are respectively $R_0, R_1, \ldots, R_N$ in sequence, wherein the plurality of column address random numbers corresponding to the second count value counted from 0 to N are respectively $C_0, C_1, \ldots C_N$ in sequence, and wherein $C_i = R_{N-i}$, i is an integer from 0 to N, and N is a maximum count value of each of the row address random number counter and the column address random number counter.

7. The tester for according to claim 6, wherein both of the row address random number counter and the column address random number counter are progressive counters or down counters, or wherein the row address random number counter is the progressive counter, and the column address random number counter is the down counter, or wherein the row address random number counter is the down counter, and the column address random number counter is the progressive counter.

8. The tester for according to claim 7, wherein when both of the row address random number counter and the column address random number counter are the progressive counters, the first specific value is N, the second specific value is N−1, an initial value of the first count value is 0, and an initial value of the second count value is 0.

9. The tester for according to claim 5, wherein the tester comprises:

a test data generation device, configured to generate the writing instruction and the writing data so that the memory writes the writing data into the memory cell corresponding to the memory address based on the writing instruction, and a memory cell tester, configured to obtain the read data output by the memory based on the read instruction to further test whether the memory cell corresponding to the memory address is fault-free.

10. A memory apparatus, comprising:

a testing device, comprising:

a memory address generation device, configured for a test mode, and comprising:

a row address random number counter, configured to receive a counting signal to update a first count value, generate a row address random number based on the first count value, and output the row address random number as a row address to a memory;

a column address random number counter, configured to receive the counting signal to update a second count value, generate a column address random number based on the second count value, and output the column address random number as a column address to the memory, wherein the row address and the column address form a memory address; and a control unit, electrically connected to the row address random number counter and the column address random number counter, wherein when the first count value is a first specific value and the second count value is a second specific value, the control unit ends the test mode, and wherein when the first count value is the first specific value but the second count value is not the second specific value, the control unit sets the first count value of the row address random number counter and the second count value of the column address random number counter;

wherein the row address random number counter and the column address random number counter use a cyclic count, and wherein a difference value between the currently generated row address and the previously generated row address is greater than or equal to 2, and a difference value between the currently generated column address and the previously generated column address is greater than or equal to 2; and a tester, electrically connected to the memory address generation device, configured to generate a writing instruction and a writing data for testing the memory so that the memory writes the writing data into a memory cell corresponding to the memory address based on the writing instruction, and configured to obtain a read data output by the memory based on a read instruction to further test whether the memory cell corresponding to the memory is fault-free; and the memory.

11. The memory apparatus according to claim 10, wherein the plurality of row address random numbers corresponding to the first count value counted from 0 to the first specific value N are respectively $R_0, R_1, \ldots, R_N$ in sequence, wherein the plurality of column address random numbers corresponding to the second count value counted from 0 to N are respectively $C_0, C_1, \ldots, C_N$ in sequence, and wherein $C_i = R_{N-i}$ is an integer from 0 to N, and N is a maximum count value of each of the row address random number counter and the column address random number counter.

12. The memory apparatus according to claim 11, wherein both of the row address random number counter and the column address random number counter are progressive counters or down counters, wherein the row address random number counter is the progressive counter, and the column address random number counter is the down counter, or wherein the row address random number counter is the down counter, and the column address random number counter is the progressive counter.

13. The memory apparatus according to claim 12, wherein when both of the row address random number counter and the column address random number counter are the progressive counters, the first specific value is N, the second specific value is N−1, an initial value of the first count value is 0, and an initial value of the second count value is 0.

14. The memory apparatus according to claim 10, wherein the memory apparatus further comprises:
   a bus interface;
   a processing core, electrically connected to the bus interface; and
   a multiplexer, electrically connected to the processing core and the testing device, and configured to select an output from the processing core or the testing device, and output to the memory.

15. The memory apparatus according to claim 14, wherein the testing device is a built-in self-test (BIST) memory testing device.

* * * * *